United States Patent [19]
Leon et al.

[11] Patent Number: 5,621,255
[45] Date of Patent: Apr. 15, 1997

[54] MARX GENERATOR

[75] Inventors: Jean-Francois Leon, Le Bourg; Bernard Etlicher, Les Molieres; Philippe Auvray, Lardy; Henri Lamain, Clamart, all of France

[73] Assignee: Etat Francais represente par le Delegue General pour l'Armement, Armees, France

[21] Appl. No.: 212,849

[22] Filed: Mar. 15, 1994

[30] Foreign Application Priority Data

Mar. 18, 1993 [FR] France .................................. 93 03116

[51] Int. Cl.$^6$ ..................................................... H02M 7/32
[52] U.S. Cl. ......................... 307/106; 361/766; 361/782; 333/20; 320/1
[58] Field of Search .................................. 307/106, 107, 307/108, 109, 110; 331/129; 333/20, 24 R, 24 C; 363/59; 320/1; 318/130; 361/766, 782, 811, 763

[56] References Cited

U.S. PATENT DOCUMENTS

| | | | |
|---|---|---|---|
| 3,589,003 | 6/1971 | Kastner | 307/110 |
| 3,628,122 | 12/1971 | Rodewald | 320/1 |
| 3,743,852 | 7/1973 | O'Keefe | 307/108 |
| 3,845,322 | 10/1974 | Aslin | 307/108 |
| 5,044,714 | 9/1991 | Taylor | 385/5 |
| 5,066,928 | 11/1991 | Ikezi et al. | 333/20 |
| 5,153,460 | 10/1992 | Bovino | 307/108 |
| 5,311,067 | 5/1994 | Grothaus et al. | 307/108 |

OTHER PUBLICATIONS

M. Obara et al.; "Strip-Line Multichannel-Surface-Spark-Gap-Type Marx Generator for Fast Discharge Lasers," *IEEE Conference Record of the 1980 Fourteenth Pulse Power Modulator Symposium*, USA, Jun. 3-5, 1980, pp. 201-208.

G. Bauer et al., "A low-impedance high-voltage nanosecond pulser", *Journal of Scientific Instruments*, Jun. 1, 1968, vol. 1, pp. 688-689.

Journal of Scientific Instruments, vol. 1, Jun. 1, 1968, London, GB, pp. 688-689, G. Bauer et al. "A low-impedance high-voltage nanosecond pulser", p. 688, col. 2, line20-47, Fig. 1.

*Primary Examiner*—William M. Shoop, Jr.
*Assistant Examiner*—Peter Ganjoo
*Attorney, Agent, or Firm*—Oliff & Berridge

[57] ABSTRACT

A Marx generator, includes a number of capacitors (E) connected in series via spark gaps (E), between two output terminals and a power supply circuit that charges the capacitors in parallel. The capacitors are connected in series by a flat line formed of two metal strips running parallel and facing one another. These strips are connected together electrically at one end of the line and respectively to the output terminals at the other end and consist of one continuous strip and a second strip subdivided by transverse slots into successive plane sections interconnected in series alternately by a capacitor and a surface spark gap. A structure of this kind reduces the inductance of the generator and hence improves the rise time of the output pulses.

5 Claims, 2 Drawing Sheets

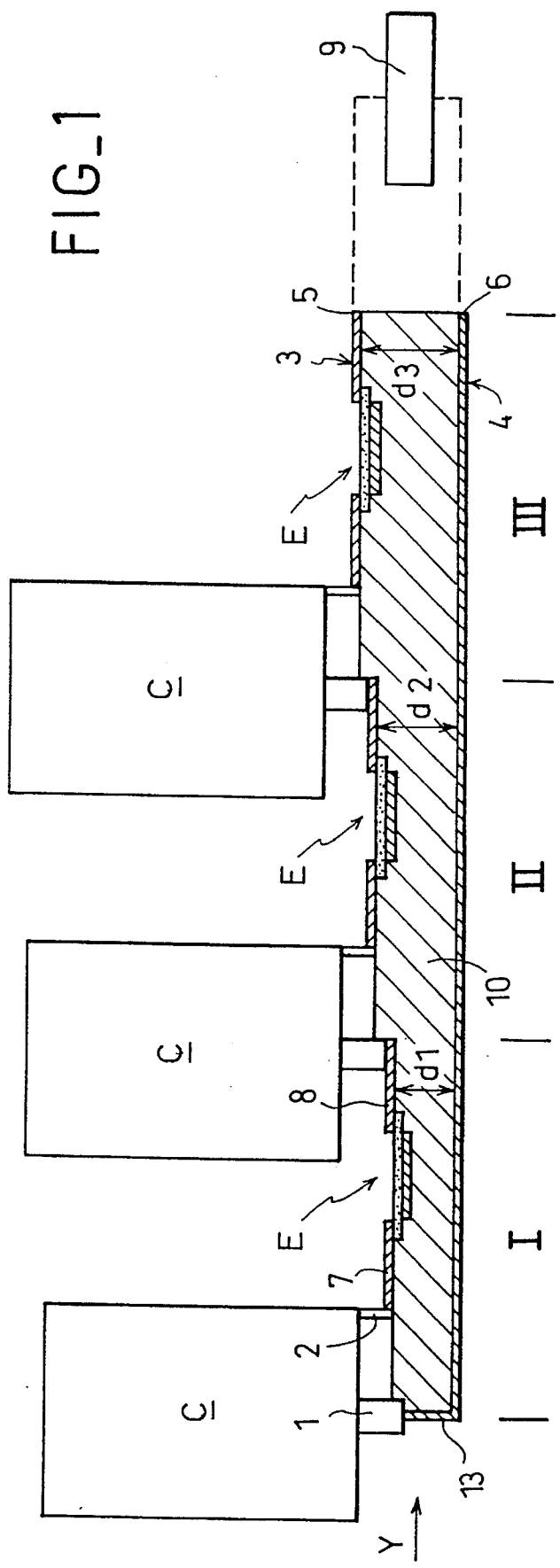
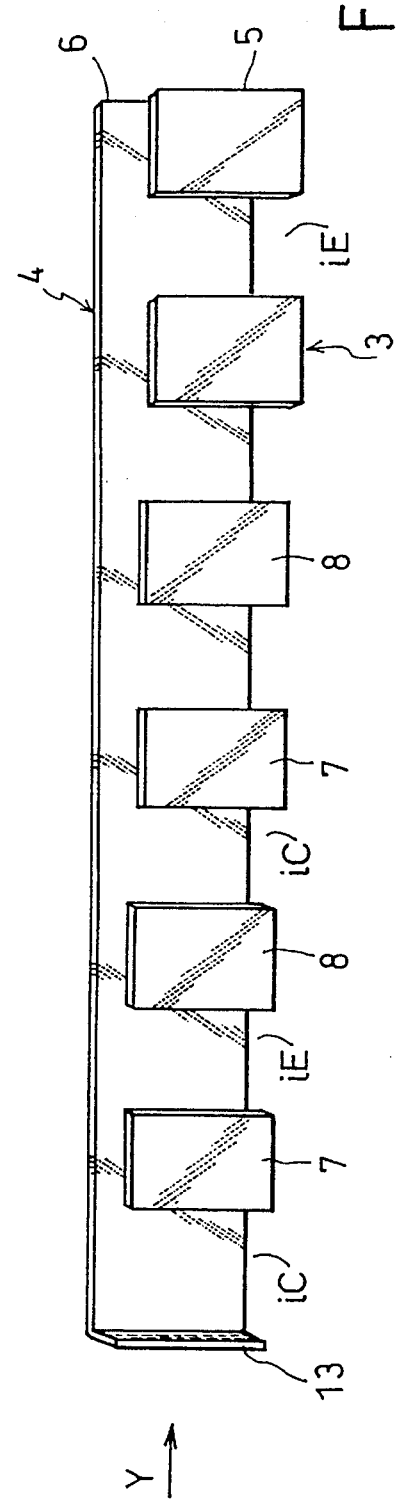

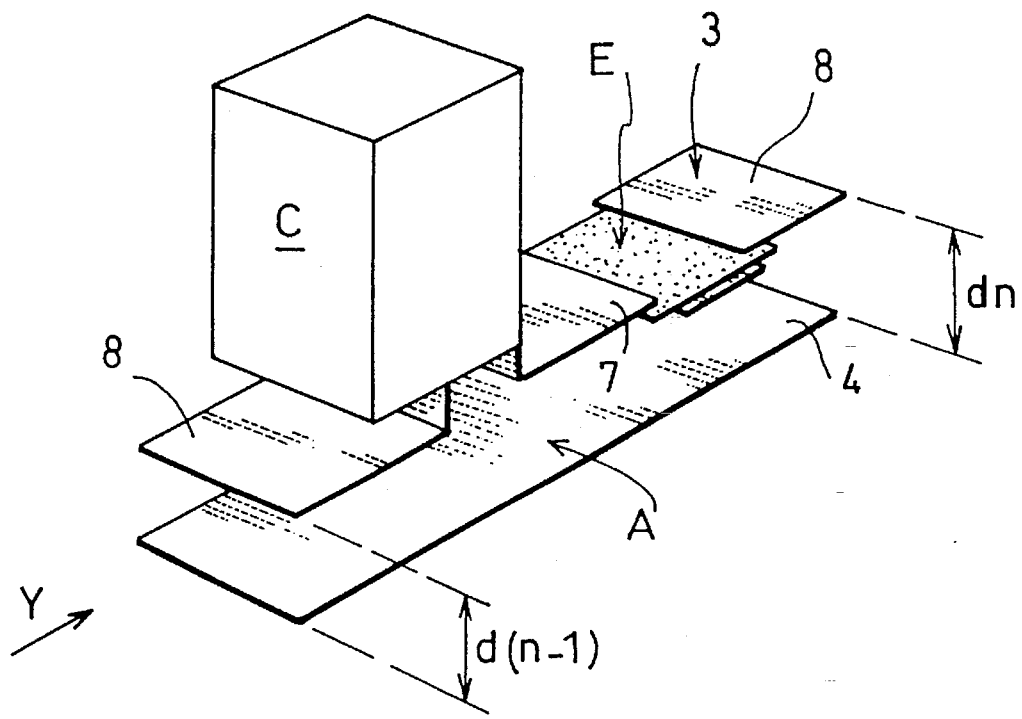
FIG_3
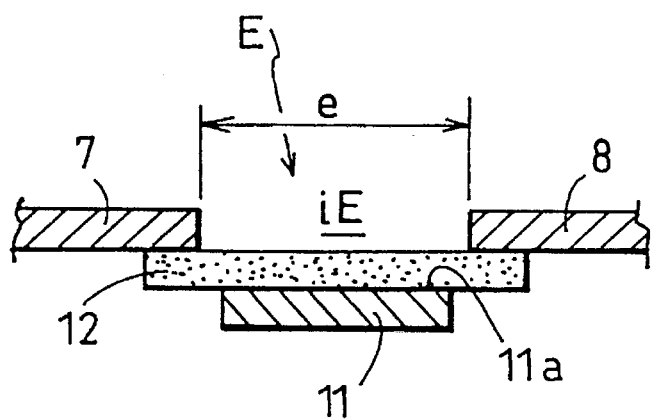
FIG_4

MARX GENERATOR

BACKGROUND OF THE INVENTION

1. Field of the Invention

The invention concerns a Marx generator and more specifically to Marx generators capable of storing and delivering energies of the order of 100 kJ to several megajoules.

2. Description of Related Art

A Marx generator is a high voltage pulse generator whose essential function is to store electrical energy and then to deliver it as a high power, high voltage pulse. It consists essentially of a series of capacitors connected together in such a way that they can be charged in parallel and discharged in series. A power supply circuit provides the parallel charge to the capacitors which, being connected in series through spark gaps, discharge in series when the spark gaps are actuated.

The capacitors discharge into a load connected across the two output terminals of the generator.

A Marx generator is essentially characterized by three electrical parameters:

the energy W it is capable of storing;

its output voltage $V_s$, i.e. the maximum peak voltage of the output pulse it can deliver; and the rise time of this pulse, which is equivalent to one quarter of the period of the Marx generator oscillating independently when its output terminals are short-circuited. This quarter period is expressed as follows:

$$t_q = \frac{\pi}{2V_s} \sqrt{2WL}$$

where L is the total inductance of the generator.

This expression sets out an important and general law governing the behavior of this type of electrical system: in order to build Marx generators with minimum quarter period for a given stored energy, it is necessary:

either to increase the voltage $V_s$, or to reduce the inductance L of the system.

A review of the characteristics of a few existing Marx generators shows that the fundamental disadvantage of existing systems lies in that energy pulses with a short rise time can be obtained only by means of a high voltage $V_s$ (in practice, above 700 kV). In certain cases, this high voltage requirement is justified only by a demand for speed and penalizes the performance of systems using these Marx generators by imposing greater spacing between the different conductors and a substantial increase in the quality of dielectrics used. Moreover, increasing the operating voltage of a Marx generator inevitably produces an increase in its inductance by imposing greater spacing between the conductors. Finally, the costs of maintaining such systems increased significantly with their operating voltages.

SUMMARY OF THE INVENTION

The aim of the present invention is to reduce the rise time of the pulses delivered by a Marx generator by reducing its inductance.

This objective is achieved by a Marx generator in which the capacitors are connected in series by a flat line formed by two metal strips facing one another. The two metal strips are parallel to the same plane and run in the same longitudinal direction. The two strips are electrically connected together at one end of the line and are connected to the output terminals at the other end. The two strips comprise one continuous strip and a second strip divided by transverse slots into successive plane sections interconnected in series by a capacitor and by a spark gap alternately.

A capacitor interconnection line using this structure adds very little inductance to that inherent in each capacitor, which reduces the value of the quantity $t_q$ and hence reduce the rise time of the output pulses. This makes it possible to increase the number of series stages in the generator where each stage corresponding to a capacitor.

In a particularly advantageous embodiment, the sections, are separated by a slot in which a spark gap is placed, are arranged in the same plane. Each spark gap is a surface spark gap which, when actuated, creates a plane conducting zone between the two sections in the same plane.

A spark gap of such a type has the particular feature of generating a conducting layer of electric arcs between the two sections where it is placed. The conducting layer provides not only electrical but also geometrical continuity from one section to the next, such that the introduced inductance is minimized. More particularly, each spark gap can comprise a metal actuation electrode positioned facing the slot, and offering a surface parallel to the plane and having dimensions similar to those of the slot, together with an insulating sheet forming a spacer, introduced between the actuation electrode and the edges of the said sections. A spark gap with such a structure can be integrated perfectly into the flat strip on which it is mounted. It is also appropriate for the distance between each pair of sections in the second strip linked by a spark gap and the first strip to be fixed as a function of the potential difference which appears between this pair of sections and the first strip when the spark gaps are actuated and rendered conducting. Thus the thickness of the line differs from one stage to another in the generator, and is precisely calculated to minimize the inductance of each stage. In practice this arrangement can be achieved by making the second strip in the line (where the capacitors and spark gaps are inserted) in the form of a staircase when the first strip is flat. In conclusion, the invention enables the design and construction of Marx generators for storing large quantities of energy and having a very low inductance. For a moderate voltage $V_s$ (typically $V_s < 700$ kV), the quarter period of the generator remains close to the quarter period of the capacitors chosen for building the system. The number of series stages in the generator has little effect on the rise time of the pulse delivered into a short-circuit.

BRIEF DESCRIPTIONS OF THE DRAWINGS

Other specific features and advantages of the invention will become clear from the following description, having regard to the attached drawings of one non-limiting embodiment.

FIG. 1 shows a schematic longitudinal section of a Marx generator according to the invention.

FIG. 2 is a top view with a slight degree of perspective of the connecting line of the generator in FIG. 1 from which the capacitors and spark gaps have been omitted.

FIG. 3 is a simplified perspective view of one of the stages of the generator in FIG. 1.

FIG. 4 is a larger scale view of one of the spark gaps of the generator in FIG. 1.

DETAILED DESCRIPTION OF THE PREFERRED EMBODIMENTS

The Marx generator shown in FIG. 1 comprises three stages I, II and III, each having a capacitor C contained in a parallelepiped box (FIG. 3) and having its two connecting terminals 1, 2 on the same surface of this box. The three capacitors C are electrically connected in series by one of the strips of a flat line formed by two parallel strips 3, 4 running in the same longitudinal direction Y. For this purpose, the upper strip 3 is interrupted by three successive gaps iC (FIG. 2). The edges of the strip bounding each of these gaps are connected respectively to the terminals of one of the capacitors C. The parts of the strip 3 running from terminal 2 of one capacitor to terminal 1 of the next capacitor or, as regards the last stage III, to the output terminal 5 of strip 3, are themselves subdivided into two sections 7, 8. Each of the two sections 7, 8 are situated in the same plane and are separated by a gap iE.

A spark gap E placed in gap iE is designed to connect these two sections 7, 8 together electrically when required. The lower strip 4, which is maintained at ground potential, runs continuously along the same length as the upper strip 3 and is subdivided into successive sections 7, 8. The lower strip 4 ends with an output terminal 6 opposite the output terminal 5 of the strip 3. The load 9 is connected to these terminals 5,6 into which the Marx generator discharges. The two opposite ends of the flat line are short-circuited by a connection 13.

The space A between the strips 3 and 4 of the line is filled with a substance 10 of high dielectric strength (for example, 350 kV/cm); whether this dielectric is solid, liquid or gaseous, it must be capable of providing the necessary electrical insulation between the strips during the discharge phase of the Marx generator, when the capacitors C, previously charged in parallel to a voltage V through a charging circuit not shown, are discharged in series by the actuation of spark gaps E, which, then becoming conducting, establish the continuity of the strip 3 between each capacitor and the subsequent capacitor on the output terminal 5.

As the capacitors discharge in series, the sections 7 and 8 of stage I are raised to a voltage V with respect to the grounded strip 4. The sections 7 and 8 of stage II are raised to a voltage 2V and the sections 7 and 8 in stage III are raised to a voltage 3 V Consequently the spacing between the pairs of sections 7, 8 of strip 3 and strip 4 are increasing values d1, d2 and d3 (or, for any number of stages, . . .d(n−1), dn, d(n+1). . . ) as shown on FIGS. 1 and 3. For this reason the upper strip 3, in the present example, has a staircase shape whose steps are formed by the pairs of sections 7, 8 and which rises from the short-circuited end of the line to the output terminals 5, 6. The lower strip 4 is flat (see FIG. 1).

As FIG. 4 shows, a spark gap E comprises an initiating electrode 11 and a rigid dielectric sheet 12 (for example in polyethylene). The electrode 11 has a flat surface 11a of rectangular boundary and has dimensions similar to the gap iE where the spark gap is placed. This surface 11a is parallel to the plane of the sections 7 and 8 bounding the gap, and a short distance from them, by the dielectric sheet 12, introduced between the electrode 11 and the sections 7 and 8 on the edges of which it rests. The width e of the gap iE is chosen as a function of the charging voltage V of each of the capacitors C.

A spark gap E behaves like a switch connected between the sections 7 and 8. When a sufficient voltage is applied to the initiating electrode 11, a large number of electric arcs are created between the facing edges of the sections 7 and 8. This allows a current to pass between the sections corresponding to the closure of the switch. Such a spark gap has a "surface" action localized in the plane common to the sections at 7 and 8 between which it is placed. Therefore, the sections 7 and 8 are linked together by a continuous connection in this plane. As a result, the inductance introduced to the strip 3 of the flat line by each of the spark gaps E is minimized. To operate the Marx generator, the capacitors are first charged in parallel to a voltage V by means of the auxiliary charging circuit mentioned earlier. Then, when the capacitors are fully charged, the spark gaps E are simultaneously energized by applying an appropriate voltage to their initiating electrodes 11 by means of another auxiliary circuit not shown. They then behave like closed switches, so that the capacitors C discharge in series, via the flat line, into the load 9. The load 9 receives a high voltage pulse, the value of which can be up to NV where N is the number of stages in the generator, but whose real value depends upon the characteristics of the load.

If the load 9 is short-circuited, the duration of this pulse is related directly to the quantity $t_q$ which is the quarter period of the oscillating circuit made up of the capacitance of the capacitors C and the inductance of the line plus the inductance inherent in the capacitors. This quantity $t_q$ is expressed, as we have already seen:

$$t_q = \frac{\pi}{2V_s} \sqrt{2WL}$$

To reduce the value of the quantity $t_q$ one can either increase the product N×V or reduce the total inductance L of the system. The use of a flat line described in the present example makes it possible to reduce the inductance L or, more precisely, the inductance introduced by each stage in addition to that of the capacitor C. Consequently, the addition of supplementary stages causes only a small increase in total inductance. This point has been demonstrated by means of the experiment which will now be described.

A 3-stage Marx generator according to the preceding description was built, using 0.1 μF capacitors operating at 50 kV (with an intrinsic inductance of 20 nH). The capacitors were charged in parallel to a voltage V=22 kV. Each of the three surface spark gaps E, mounted in a gap iE of width 25 mm, was operated by the same initiating generator capable of delivering a voltage of the order of 30 kV.

In this way 27 kA pulses at 66 kV with a period of 360 ns were obtained. These results allow the total inductance L to be calculated using the formula given above, which can be written:

$$L = (t_q/\pi)^2 (1/C_{glob}),$$

where $C_{glob}$ is the overall capacitance of the Marx generator (equal to a third of the capacitance of each of the three capacitors C). Replacing the symbols by their numerical values, the value of L is found to be very close to 100 nH. If the experiment is repeated with a generator limited to a single stage, but with an identical line, an output pulse is obtained, which has a period only slightly different from the above.

It can be seen that since the three-stage generator has virtually the same period as that with one stage, the addition of further stages introduces virtually no extra inductance.

It is therefore possible to build Marx generators with N stages for which the quarter period varies little for moderate voltages $V_s$ ($V_s$=700 kV), but whose energy increases in proportion with the number of stages.

We claim:

1. A Marx generator comprising;

a continuous metal strip having a first end and a second end;

a subdivided metal strip having a first end and a second end, the continuous strip substantially parallel to the subdivided strip, the first end of the continuous strip being electrically connected to the first end of the subdivided strip;

a respective output terminal formed at each of the second end of the continuous strip and the second end of the subdivided strip;

a plurality of capacitors connected in series along the subdivided strip;

a plurality of spark gaps positioned along the subdivided strip between each of the capacitors in series and one spark gap positioned between a last one of the capacitors and the output terminal formed at the second end of the subdivided strip, said subdivided strip subdivided by transverse slots into successive two plane sections.

2. The generator according to claim 1, wherein each spark gap further comprising a slot separating the two plane sections of each spark gap, and wherein when each spark gap is actuated, a plane conducting zone is created across the respective slot.

3. The generator according to claim 2, wherein each spark gap further comprises a metal actuation electrode; and an insulating sheet positioned adjacent the two plane sections and over said metal actuation electrode so that said insulating sheet is positioned between said two plane sections and said metal actuation sheet.

4. The generator according to claim 1, wherein a distance between the two plane sections of each spark gap and the continuous strip is fixed as a function of a potential difference appearing between the respective two plane sections when the respective spark gap is actuated.

5. The generator according to claim 4, wherein the continuous strip is flat and the subdivided strip is in a shape of a staircase.

* * * * *